(12) United States Patent
Markytan et al.

(10) Patent No.: US 9,385,286 B2
(45) Date of Patent: Jul. 5, 2016

(54) OPTOELECTRONIC COMPONENT

(71) Applicant: OSRAM Opto Semiconductors GmbH, Regensburg (DE)

(72) Inventors: Ales Markytan, Regensburg (DE); Christian Gaertner, Regensburg (DE); Roland Schulz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/440,051

(22) PCT Filed: Oct. 23, 2013

(86) PCT No.: PCT/EP2013/072185
§ 371 (c)(1),
(2) Date: Apr. 30, 2015

(87) PCT Pub. No.: WO2014/067834
PCT Pub. Date: May 8, 2014

(65) Prior Publication Data
US 2015/0255691 A1 Sep. 10, 2015

(30) Foreign Application Priority Data
Oct. 30, 2012 (DE) .......................... 10 2012 110 403

(51) Int. Cl.
*H01L 33/00* (2010.01)
*H01L 33/58* (2010.01)
(Continued)

(52) U.S. Cl.
CPC ............ *H01L 33/58* (2013.01); *G02B 19/0014* (2013.01); *G02B 19/0061* (2013.01); *G02B 27/0955* (2013.01); *H01L 33/54* (2013.01); *H01L 2924/0002* (2013.01)

(58) Field of Classification Search
CPC ........ H01L 33/486; H01L 33/64; H01L 33/58
USPC ............................................................ 257/98
See application file for complete search history.

(56) References Cited

U.S. PATENT DOCUMENTS 5,623,181 A 4/1997 Suehiro et al.
6,050,707 A 4/2000 Kondo et al.
(Continued)

FOREIGN PATENT DOCUMENTS

DE 102006050880 A1 4/2008
DE 102010027212 A1 1/2012
(Continued)

OTHER PUBLICATIONS

"Superellipse", From Wikipedia, the free encyclopedia, <http://en.wikipedia.org/w/index.php? title=Superellipse&oldid=72284331>, retrieved Jan. 28, 2014, pp. 1-3.

*Primary Examiner* — Trung Q Dang
(74) *Attorney, Agent, or Firm* — McDermott Will & Emery LLP

(57) ABSTRACT

An optoelectronic component comprises: at least one semiconductor chip suitable for generating electromagnetic radiation, a beam shaping element (1), through which at least part of the electromagnetic radiation emitted by the semiconductor chip during operation passes and which has an optical axis (2), and which has an outer contour (5) with respect to a coordinate system (3, 4) perpendicular to the optical axis (2), wherein the contour (5) constitutes a curve (n) that is mirror-symmetrical with respect to both central axes (a1, a2) of an ellipse (e) inscribed by the contour, wherein the following succeed one another in each of the four identical sections between the respective central axes (a1, a2): an ellipse segment (b1), a linear part (c1) a second ellipse segment (d), a further linear part (c2) and a third ellipse segment (b2).

8 Claims, 3 Drawing Sheets

Figure 1:
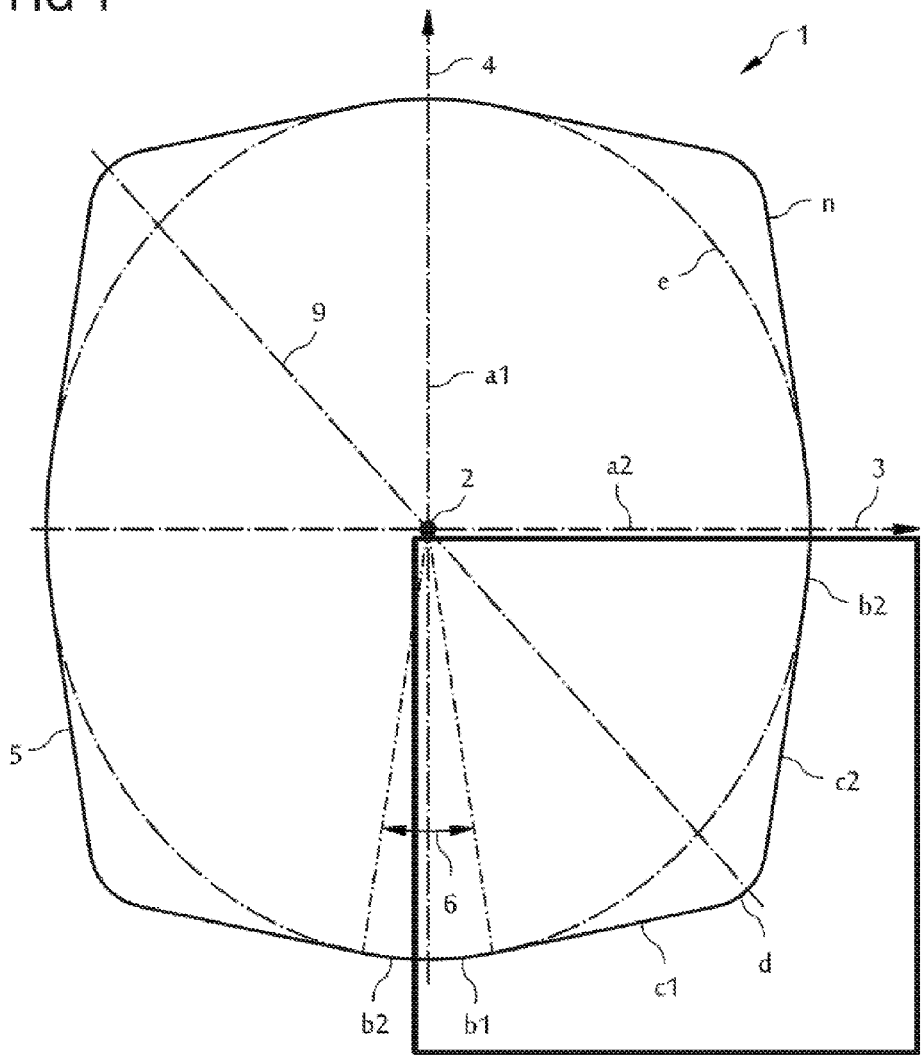

(51) Int. Cl.
*G02B 27/09* (2006.01)
*G02B 19/00* (2006.01)
*H01L 33/54* (2010.01)

(56) References Cited

U.S. PATENT DOCUMENTS

2009/0020773 A1* 1/2009 Nomura .................. H01L 33/58
257/98
2009/0040769 A1 2/2009 Parkyn et al.
2010/0232166 A1* 9/2010 Ho ............................ F21V 5/04
362/335
2011/0063874 A1 3/2011 Yatsuda et al.
2013/0077304 A1* 3/2013 Gordin .................... F21V 5/001
362/235

FOREIGN PATENT DOCUMENTS

| WO | 2010/108761 A1 | 9/2010 |
| WO | 2012/007392 A1 | 1/2012 |
| WO | 2012/132872 A1 | 10/2012 |

* cited by examiner

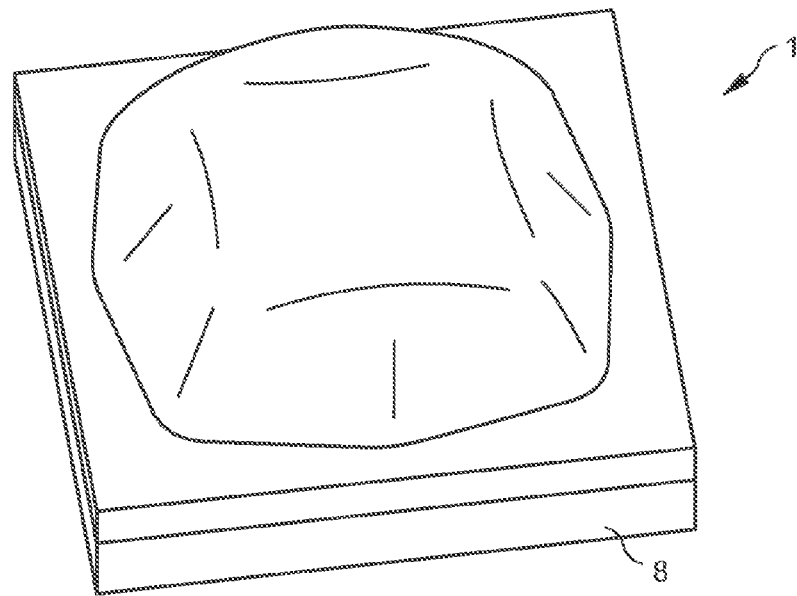
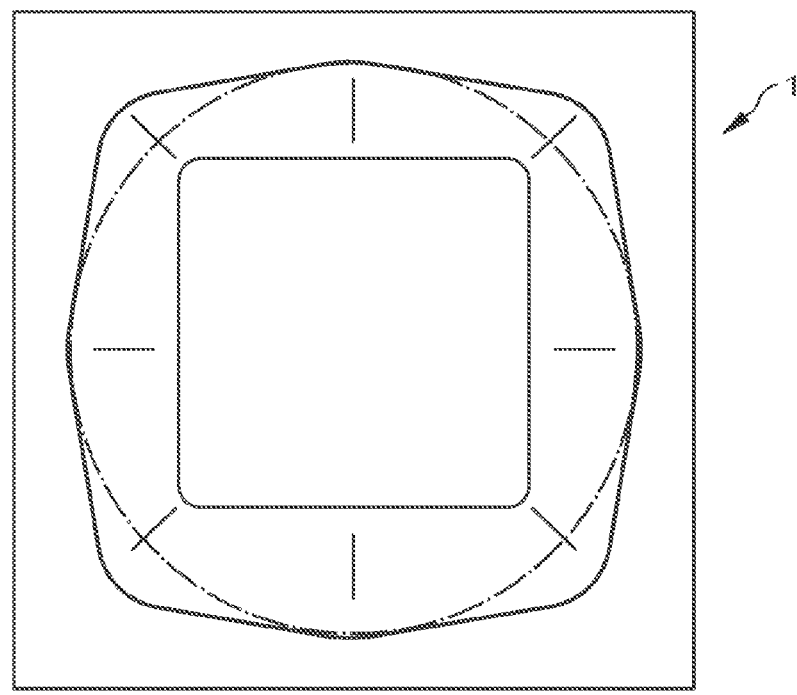

OPTOELECTRONIC COMPONENT

The invention relates to an optoelectronic component.

This patent application claims the priority of German patent application 10 2012 110 403.4, the disclosure content of which is hereby incorporated by reference.

Semiconductor chips which emit electromagnetic radiation, for example LED chips and LED packages comprising such chips, conventionally have rectangular dimensions, in particular. The coupling-out lenses of the LED packages are often elliptically or even rotationally symmetrically circularly shaped in order to enable a rotation-independent pick-up by means of pick-up tools. Therefore, the distance in the corner region of the rectangular semiconductor chip with respect to the circular lens surface is significantly smaller than in the region of the chip center.

A smaller distance between the chip and the lens surface has the consequence that the efficacy of the lens with regard to shaping the light decreases, and thus so does the possibility for influencing the light distribution curve. Furthermore, coupling-out losses can occur as a result of total internal reflection in this region. Moreover, a non-rotationally symmetrical emission profile can arise since the light distribution curves in the corner region of the chip and in the chip center differ.

It is desirable to provide an optoelectronic component which enables effective coupling-out of light.

In accordance with one embodiment of the invention, an optoelectronic component comprises at least one semiconductor chip suitable for generating electromagnetic radiation. The optoelectronic component comprises a beam shaping element, through which at least part of the electromagnetic radiation emitted by the semiconductor chip during operation passes and which has an optical axis. The beam shaping element has an outer contour with respect to a coordinate system perpendicular to the optical axis. The contour constitutes a curve that is mirror-symmetrical with respect to both central axes of an ellipse inscribed by the contour. The following succeed one another in each of the four identical sections between the respective central axes: an ellipse segment, a linear part, a second ellipse segment, a further linear part and a third ellipse segment.

In accordance with further aspects, the invention encompasses an optoelectronic component comprising at least one semiconductor chip suitable for generating electromagnetic radiation. The optoelectronic component comprises a beam shaping element, through which at least part of the electromagnetic radiation emitted by the semiconductor chip during operation passes and which has an optical axis. The beam shaping element has an outer contour with respect to a coordinate system perpendicular to the optical axis, which outer contour deviates from a circular shape along a diagonal of the semiconductor chip, such that the beam shaping element has a rotationally symmetrical emission characteristic.

The beam shaping element is a coupling-out lens, in particular. The coupling-out lens has at least one horizontal section parallel to the substrate plane of the semiconductor chip, the contour of which lies between the inscribed ellipse and the circumscribing rectangle. The contour or the curve is mirror-symmetrical with respect to both central axes. The curve comprises four identical sections that can be converted to one another in each case by mirroring at the central axes. The sections in each case directly adjoin the next section.

By virtue of the fact that in accordance with embodiments the beam shaping element is mirror-symmetrical with respect to both central axes and deviates from a pure elliptical or rotationally symmetrically circular contour, the optoelectronic component has a high coupling-out efficiency since the total internal reflection particularly in the corner region of the semiconductor chip is reduced. Moreover, the beam shaping element can be dimensioned with a compact dimensioning with respect to the semiconductor chip. The optoelectronic component can be produced cost-effectively as a result. Consequently, a beam shaping element is provided which has two planes of symmetry and enables a very good coupling-out of the electromagnetic radiation from the semiconductor chip and which at the same time is comparatively small relative to the chip size and nevertheless enables a rotationally symmetrical emission.

In accordance with embodiments, the curve deviates from a rectangular shape. As a result, the beam shaping element is readily automatically manageable since it has a good tolerance with respect to rotation of the optoelectronic component or of the beam shaping element in relation to the automatic circular element. By way of example, the automatic handling is carried out by means of vacuum suction nozzles which grip in a flat region of the optoelectronic component. The tolerance with respect to rotation of the component is for example +/−10%. Production-dictated damage particularly to the beam shaping element can be avoided as a result.

The beam shaping element therefore enables a lens which is as compact as possible, which simultaneously has a high coupling-out efficiency, enables a symmetrical emission characteristic of the component and moreover is robust with respect to manufacturing tolerances. A high coupling-out efficiency, a suitable rotationally symmetrical emission characteristic and the robustness with respect to manufacturing tolerances are conventionally fulfilled with large lenses, which leads to higher costs.

In accordance with embodiments, the beam shaping element is composed of a silicone. By way of example, the beam shaping element has a refractive index of 1.41. In accordance with further embodiments, the beam shaping element has a refractive index of 1.54.

In accordance with further embodiments, the ellipse segment and the third ellipse segment together form an angle that is greater than 0° and < or =30°. The angle is predefined and results from the maximum required tolerance with regard to rotation of the component during automatic handling in the course of manufacture. The larger the angle, the greater the tolerance with regard to a rotation. This means that even in the case of a relatively large rotation of the gripping element with respect to the optoelectronic component or the beam shaping element, the component can be gripped without the beam shaping element being damaged.

In accordance with further embodiments, the ratio of linear part to further linear part corresponds to the ratio of further central axis to central axis. A compact lens having a good robustness with respect to manufacturing tolerances is made possible as a result.

In accordance with further embodiments, the second ellipse segment has a first and a second semi-axis. The length of the first semi-axis is > or =0 and < or =⅓ of the length of the central axis. The length of the second semi-axis is > or =0 and < or =⅓ of the length of the further central axis. The length of the semi-axes and thus the shape of the second ellipse segment is predefined in each case by the lens production process. By way of example, the length of the second ellipse segment is between 0.05 mm and 0.5 mm.

In accordance with further embodiments, the two central axes of the inscribed ellipse are of identical length. In accordance with embodiments, the inscribed ellipse is a circle. Further advantages, features and developments will become apparent from the example explained below in association with the figures. In this case, elements that are identical, of identical type or act identically may be provided with the same reference signs.

Figure 2:
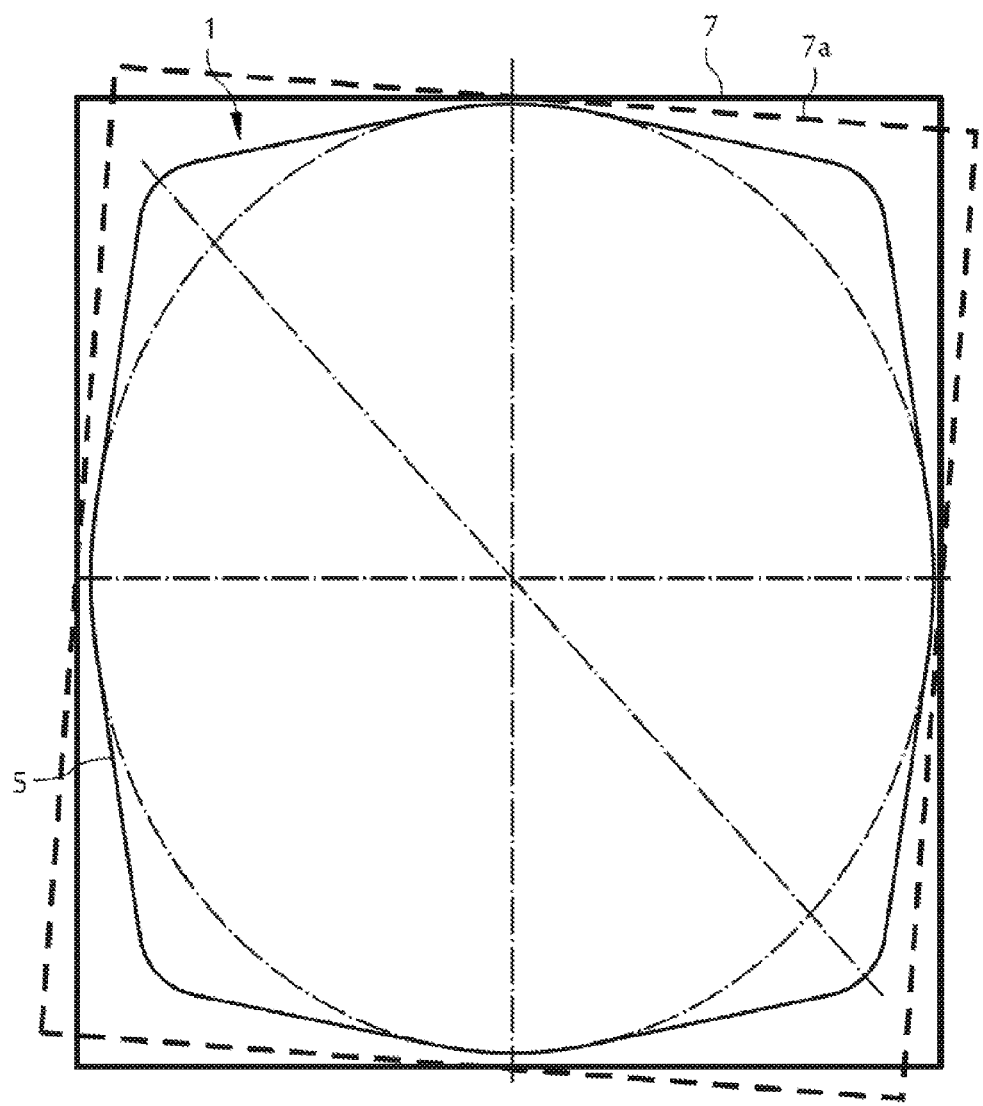

In the figures:

FIG. 1 shows a schematic illustration of a plan view of a beam shaping element in accordance with one embodiment, FIG. 2 shows a schematic illustration of a plan view of a beam shaping element with a pick-up tool in accordance with one embodiment, and FIGS. 3A and 3B show a schematic illustration of an optoelectronic component in accordance with one embodiment.

FIG. 1 schematically shows a sectional view through a beam shaping element 1 transversely with respect to an optical axis 2 of the beam shaping element 1. The sectional view is in the plane of a coordinate system 3, 4 oriented perpendicularly to the optical axis 2. The beam shaping element has an outer contour 5. The beam shaping element is, in particular, a lens that can be coupled to a semiconductor chip 8 (FIG. 3A).

The contour 5 constitutes a curve n that inscribes an ellipse e. The ellipse e has two central axes a1 and a2. The contour 5 or the curve n is mirror-symmetrical with respect to both central axes a1 and a2. The beam shaping element 1 or the curve n is mirror-symmetrical with respect to a mirroring at a plane through the first axis 3 of the coordinate system and the optical axis 5 and with respect to a mirroring at a plane through the second axis 4 of the coordinate system and the optical axis 5. The beam shaping element 1 is quadrant-symmetrical.

As a result of the shaping of the beam shaping element 1, part of the electromagnetic radiation emitted by a semiconductor chip coupled to the beam shaping element 1 during operation is refracted. The beam shaping element 1 enables rotationally symmetrical beam shaping, even though the beam shaping element 1 is not rotationally symmetrical.

Three ellipse segments b1, b2 and d and two linear parts c1 and c2 are arranged in each quadrant between the central axes a1 and a2, which correspond in particular to the axes 3 and 4 of the coordinate system.

Beginning at the point of intersection of the curve n with the central axis a1, there is arranged firstly the ellipse segment e1. The linear part c1 is arranged subsequently. The linear part c1 is adjoined by the second ellipse segment d. The second ellipse segment d is adjoined by the further linear part c2. The further linear part c2 is adjoined by the third ellipse segment b2. The end of the third ellipse segment b2 lies at the point of intersection of the curve n with the second central axis a2.

The sequence of ellipse segments and linear parts is repeated in the next quadrant. Accordingly, therefore, the third ellipse segment b2 at the point of intersection of the curve n with the second central axis a2 is once again adjoined by the first ellipse segment b1.

The ellipse segments b1 and b2 form an angle 6. The angle 6 lies between a connection of the beginning of the third ellipse segment b2 and the optical axis 2 in the plane of the coordinate system 3, 4 and serves for connecting the end of the ellipse segment b1 and the optical axis 2. The angle 6 is in a range of between 0 and 30°, in particular. In the exemplary embodiment shown, the angle 6 has a value of 20°.

The angle 6 predefines the extent to which the linear regions c1 and c2 are in each case inclined with respect to the central axes a1 and a2. As explained in greater detail in association with FIG. 2, a larger angle 6 and thus a greater inclination of the linear parts c1 and c2 means a larger tolerance with regard to rotation in the case of automatic handling during manufacture.

The second ellipse segment d is arranged between the linear part c1 and the linear part c2. The transition between the linear regions c1 and c2 is therefore embodied in an elliptical fashion, and is not pointed. The length of the region d is defined by the lens production process and is in a range of 0.05 to 0.5 mm, for example.

The ellipse segment d has a first semi-axis, the length of which is between 0 and ⅓ of the length of a1. The second semi-axis of the ellipse segment d has a length that is between 0 and ⅓ of the length of the central axis a2. The linear parts c1 and c2 each have a length such that the ratio of the length of the linear part c1 to the length of the linear part c2 is equal to the ratio of the length of the central axis a2 to the length of the central axis a1.

In accordance with embodiments, the two central axes a1 and a2 are of identical length. In accordance with further embodiments, the length of the central axis a1 differs from the length of the central axis a2. In accordance with embodiments, the angle 6 has a value of 0° and the central axes of the ellipse segment each have a value of 0. Consequently, the curve n describes a square shape.

The beam shaping element having the contour 5 that describes the curve n makes it possible, in the case of a predefined package size for the optoelectronic component and a predefined size of the semiconductor chip, which is in particular rectangular and for example square, to reduce the size of the beam shaping element in conjunction with the light coupling-out efficiency remaining the same in comparison with conventional lenses. With the lens size remaining the same, it is possible to increase the coupling-out efficiency.

By way of example, the minimum size for a lens can be calculated by means of the product of the refractive index of the lens material and the size of the semiconductor chip. In the case of rectangular semiconductor chips, the minimum lens size thus results for the diagonal of the semiconductor chip, such that as little total internal reflection as possible occurs at the transition from lens to air or the total internal reflection can be almost completely avoided. For lenses having an elliptical, rotationally symmetrical contour, the minimum lens size calculated in this way is chosen for the entire lens, even though in regions of the lens corresponding to regions of the semiconductor chip outside the diagonal of the semiconductor chip a smaller lens size would suffice to avoid total internal reflection. This conventionally leads to comparatively large lenses in relation to the size of the semiconductor chip.

In accordance with embodiments, the contour 5 of the beam shaping element 1 in each case has a smaller diameter along the central axes a1 and a2 than along the connection 9 between the ellipse segment d and the opposite ellipse segment. The contour 5 deviates from a circular shape. The connection 9 corresponds to the diagonal of the semiconductor chip during operation. Consequently, with a predefined size of the semiconductor chip, the size of the beam shaping element is reduced in comparison with conventional lenses and at the same time the total internal reflection is avoided sufficiently.

FIG. 2 schematically shows the beam shaping element 1 and also a tool 7 for gripping the beam shaping element 1 during automatic handling in the course of manufacture. A tool 7a rotated with respect to the beam shaping element is additionally illustrated by dashed lines.

The tool 7 is optimally aligned with respect to the beam shaping element. Consequently, the tool 7 provides for the beam shaping element 1 to be raised and transported in as nondestructive manner as possible. The tool touches the flat part (FIGS. 3A and 3B) of the beam shaping element 1 outside the contour 5.

The contour 5 that describes the curve n also enables the beam shaping element 1 to be gripped and transported non-destructively by means of the rotated tool 7. By virtue of the fact that the linear parts c1 and c2 are inclined and not aligned perpendicularly to the central axes a1 and a2, the rotated tool 7a does not butt against the ellipse segment d or other corners of the contour 5. Consequently, the beam shaping element 1 tolerates a rotation of the tool 7 or 7a in the course of automatic handling. The beam shaping element tolerates in particular a rotation of the tool 7 or 7a by an angle having a value of between 0° and half of the value of the angle 6.

In accordance with the example shown, a rectangular gripping tool 7 is used. Despite the rotation of the tool 7a, the gripping tool 7a does not touch the lens body, that is to say the contour 5, and damage to the beam shaping element 1 can be avoided. By way of example, the beam shaping element 1 has a tolerance with respect to rotation in relation to the tool 7 of up to ±10°.

FIGS. 3A and 3B show an exemplary embodiment of the beam shaping element 1. In this case, FIG. 3A shows a schematic spatial illustration and FIG. 3B shows a plan view of the beam shaping element 1.

The beam shaping element as illustrated in FIGS. 3A and 3B has an angle 6 of 20°, as illustrated in FIG. 1. The two semi-axes of the ellipse segment d have a value of 0.3 mm.

FIG. 3B additionally illustrates a semiconductor chip suitable for generating electromagnetic radiation. The beam shaping element 1 is arranged on a main surface of the semiconductor chip. A large part of the emitted radiation emerges from the main surface during operation.

The semiconductor component comprises the beam shaping element 1 and the semiconductor chip 8. The semiconductor component is an optoelectronic component that enables the conversion of electrically generated data or energy into light emission, or vice versa. The semiconductor chip 8 is an optoelectronic semiconductor chip, preferably a radiation emitting semiconductor chip. The semiconductor component is preferably an optoelectronic component that enables the conversion of electrically generated data or energy into light emission, or vice versa. The semiconductor component comprises at least one optoelectronic semiconductor chip, preferably a radiation emitting semiconductor chip. The semiconductor chip is preferably an LED (light emitting diode).

The semiconductor chip comprises a semiconductor layer stack containing an active layer. The active layer is suitable in particular for generating radiation having a first wavelength. For this purpose, the active layer preferably contains a pn junction, a double heterostructure, a single quantum well structure (SQW), or a multi quantum well structure (MQW) for generating radiation. In this case, the designations quantum well structure exhibits no significance with regard to the dimensionality of the quantization. It encompasses, inter alia, quantum wells, quantum wires and quantum dots and any combination of these structures.

The semiconductor layer stack of the semiconductor chip preferably contains a III/V semiconductor material. III/V semiconductor materials are particularly suitable for generating radiation in the ultraviolet through the visible to the infrared spectral range.

The semiconductor chip has a square outer contour. The beam shaping element 1 enables a rotationally symmetrical emission of the electromagnetic radiation emitted by the semiconductor chip. In this case, the reflection within the lens is prevented or reduced and the coupling-out efficiency is increased as a result. Moreover, for the same coupling-out efficiency the beam shaping element 1 is smaller than conventional rotationally symmetrical beam shaping elements.

Theoretically, a beam shaping element having a square contour would have the highest coupling-out efficiency. However, this contour would mean a small tolerance with respect to rotations of the tool in the case of automatic handling during manufacture. The risk of damage to the beam shaping element during production is very high. Therefore, a square contour would not fulfill all the demanded requirements sufficiently well.

The beam shaping element 1 whose contour describes the curve n both has a high coupling-out efficiency close to the coupling-out efficiency of a square contour and at the same time is particularly tolerant toward rotations during automatic handling in the course of manufacture.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component, comprising:
    at least one semiconductor chip suitable for generating electromagnetic radiation,
    a beam shaping element, through which at least part of the electromagnetic radiation emitted by the semiconductor chip during operation passes and which has an optical axis, and which has an outer contour with respect to a coordinate system perpendicular to the optical axis, wherein the contour constitutes a curve that is mirror-symmetrical with respect to both central axes of an ellipse inscribed by the contour, wherein the following succeed one another in each of the four identical sections between the respective central axes: an ellipse segment, a linear part, a second ellipse segment, a further linear part and a third ellipse segment.

2. The optoelectronic component according to claim 1, wherein the ellipse segment and the third ellipse segment together form an angle that is greater than 0° and less than or equal to 30°.

3. The optoelectronic component according to claim 1, wherein the ratio of linear part to further linear part corresponds to the ratio of further central axis to central axis.

4. The optoelectronic component according to claim 1, wherein the second ellipse segment has a first and a second semi-axis, wherein the length of the first semi-axis is greater than or equal to 0 and less than or equal to ⅓ of the length of the central axis, and the length of the second semi-axis is greater than or equal to 0 and less than or equal to ⅓ of the length of the further central axis.

5. The optoelectronic component according to claim 1, wherein the second ellipse segment has a length of 0.05 mm to 0.5 mm.

6. The optoelectronic component according to claim 1, wherein the central axis and the further central axis are of identical length.

7. An optoelectronic component, comprising:
    at least one semiconductor chip suitable for generating electromagnetic radiation,
    a beam shaping element, through which at least part of the electromagnetic radiation emitted by the semiconductor chip during operation passes and which has an optical axis, and which has an outer contour with respect to a coordinate system perpendicular to the optical axis, which outer contour deviates from a circular shape along a diagonal of the semiconductor chip, such that the beam shaping element has a rotationally symmetrical emission characteristic.

8. An optoelectronic component, comprising:
at least one semiconductor chip suitable for generating electromagnetic radiation,
a beam shaping element, through which at least part of the electromagnetic radiation emitted by the semiconductor chip during operation passes and which has an optical axis, and which has an outer contour with respect to a coordinate system perpendicular to the optical axis, wherein
the contour constitutes a curve that is mirror-symmetrical with respect to both central axes of an ellipse inscribed by the contour,
the outer contour deviates from a circular shape along a diagonal of the semiconductor chip, such that the beam shaping element has a rotationally symmetrical emission characteristic, and
the following succeed one another in each of four identical sections between the respective central axes: an ellipse segment, a linear part, a second ellipse segment, a further linear part and a third ellipse segment.

* * * * *